US007279049B2

United States Patent
Kaszuba et al.

(10) Patent No.: US 7,279,049 B2
(45) Date of Patent: Oct. 9, 2007

(54) APPARATUS FOR REDUCING ENTRAPMENT OF FOREIGN MATTER ALONG A MOVEABLE SHAFT OF A SUBSTRATE SUPPORT

(75) Inventors: Andrzej Kaszuba, San Jose, CA (US); Sophia M. Velastegui, Sunnyvale, CA (US); Visweswaren Sivaramakrishnan, Santa Clara, CA (US); Pyongwon Yim, Sunnyvale, CA (US); Mario David Silvetti, Morgan Hill, CA (US); Tom K. Cho, Palo Alto, CA (US); Indrajit Lahiri, Santa Clara, CA (US); Surinder S. Bedi, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 279 days.

(21) Appl. No.: 10/775,769

(22) Filed: Feb. 5, 2004

(65) Prior Publication Data

US 2005/0172905 A1    Aug. 11, 2005

(51) Int. Cl.
  C23C 16/00     (2006.01)
  C23F 1/00      (2006.01)
  H01L 21/306    (2006.01)
(52) U.S. Cl. ............ 118/728; 156/345.51; 156/345.55; 118/730; 118/733
(58) Field of Classification Search ................ 118/729; 156/345.54
  See application file for complete search history.

(56) References Cited

U.S. PATENT DOCUMENTS 3,951,478 A * 4/1976 Olsen et al. ................ 384/130
5,273,588 A * 12/1993 Foster et al. ............. 118/723 E
5,508,519 A * 4/1996 Bennett et al. ........ 250/492.21
5,873,177 A * 2/1999 Honda et al. .................. 34/58
5,938,343 A * 8/1999 Grantz et al. ............... 384/152
6,221,221 B1 * 4/2001 Al-Shaikh et al. ..... 204/298.02
6,506,257 B2 * 1/2003 Horiguchi et al. .......... 118/725
2003/0141673 A1    7/2003 Olgado et al.

FOREIGN PATENT DOCUMENTS

| JP | 10-163155 | 6/1998 |
| JP | 11-108196 | 4/1999 |
| JP | 11-135469 | 5/1999 |

* cited by examiner

Primary Examiner—Parviz Hassanzadeh
Assistant Examiner—Rakesh K. Dhingra
(74) Attorney, Agent, or Firm—Patterson & Sheridan

(57) ABSTRACT

In one embodiment, the invention is a guard ring for reducing particle entrapment along a moveable shaft of a substrate support. In one embodiment, the guard ring comprises a substantially annular guard ring positioned within a step formed in a sleeve that circumscribes the shaft. The guard ring is positioned to substantially seal a gap separating the shaft from the sleeve, so that the amount of particles and foreign matter that travel within or become trapped in the gap is substantially reduced. In another embodiment, a guard ring comprises a base portion having an inner perimeter and an outer perimeter, a first flange coupled to the inner perimeter, a second flange coupled to the outer perimeter, and a continuous channel separating the first flange from the second flange. The first flange is adapted to function as a spring that accommodates displacement of the shaft.

13 Claims, 6 Drawing Sheets

APPARATUS FOR REDUCING ENTRAPMENT OF FOREIGN MATTER ALONG A MOVEABLE SHAFT OF A SUBSTRATE SUPPORT

BACKGROUND OF THE DISCLOSURE

1. Field of Invention

The invention relates generally to the processing of semiconductor wafers, and relates more particularly to an apparatus for reducing entrapment of foreign matter along a moveable shaft of a substrate support.

2. Background of the Invention

Integrated circuits have evolved into complex devices that can include millions of transistors, capacitors and resistors on a single chip. The evolution of chip designs continually requires faster circuitry and greater circuit density that demand increasingly precise fabrication techniques and processes. One fabrication process frequently used is chemical vapor deposition (CVD). Chemical vapor deposition is generally employed to deposit a thin film on a substrate or a semiconductor wafer.

Chemical vapor deposition is generally accomplished by introducing a precursor gas into a vacuum chamber. The precursor gas is typically directed through a showerhead situated near the top of the chamber. The precursor gas reacts to form a layer of material on the surface of the substrate that is positioned on a heated substrate support (e.g., a heater) typically fabricated from aluminum. In some systems, the substrate support is mounted upon a moveable (e.g., moveable longitudinally, or rotatable) shaft that is disposed within a sleeve. Purge gas is routed through holes in the support to the edge of the substrate to prevent deposition at the substrate's edge that may cause the substrate to adhere to the support. Deposition by-products produced during the reaction are pumped from the chamber through an exhaust system.

In operation, particles or loose foreign matter may be generated by the system, or inadvertently introduced thereto, and these particles can travel within the confines of the chamber. In particular, particles may travel near the shaft utilized to control the elevation of a substrate support within the processing chamber. The particles may stick to the moving shaft and accumulate in the annulus, or gap, between the shaft and the sleeve that guides the shaft through the bottom of the chamber. The accumulation of particles between the shaft and sleeve can damage both components, leading to premature wear and/or failure of the system.

Reducing the annulus between the sleeve and the shaft is one method for minimizing the area in which particles may travel and/or become trapped. Although reducing the gap is a generally effective method for reducing particle accumulation and damage, a small gap still exists that is typically large enough to trap smaller particles. Alternatively, some designs have employed o-rings (sometimes in conjunction with a lubricant) positioned to seal the gap. However, standard o-rings are subjected to abrasion by particulates disposed on the shaft, and thus may not effectively seal the gap after a period of use. Furthermore, standard o-rings tend to generate particles when subjected to processing chamber conditions, exacerbating the particle entrapment problem rather than solving it.

Therefore, there is a need for an apparatus for reducing the entrapment of particles and foreign matter along a moveable shaft of a substrate support.

SUMMARY OF INVENTION

In one embodiment, a guard ring for reducing particle entrapment along a moveable shaft of a substrate support is provided. In one embodiment, a substantially annular guard ring is positioned within a step formed in a sleeve that circumscribes the shaft. The guard ring is positioned to substantially seal a gap separating the shaft from the sleeve, advantageously reducing component wear due to particulate entrapment.

In another embodiment, a guard ring comprises a base portion having an inner perimeter and an outer perimeter, a first flange coupled to the inner perimeter, a second flange coupled to the outer perimeter, and a continuous channel separating the first flange from the second flange. The first flange is adapted to bias the ring against the shaft, thereby accommodating displacement and/or misalignment of the shaft relative to the processing chamber.

BRIEF DESCRIPTION OF DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION OF INVENTION

The invention is a guard ring for preventing particle entrapment along a moveable shaft of a substrate support. The invention is illustratively described below as deployed in a chemical vapor deposition system, such as a barrier chemical vapor deposition (BCVD) system, available from Applied Materials, Inc. of Santa Clara, Calif. However, it should be understood that the invention has utility in other system configurations such as physical vapor deposition systems, ion implant systems, etch systems, chemical vapor deposition systems and any other wafer processing system in which the reduction of particle damage to a moving shaft is necessary or desirable.

Figure 1:
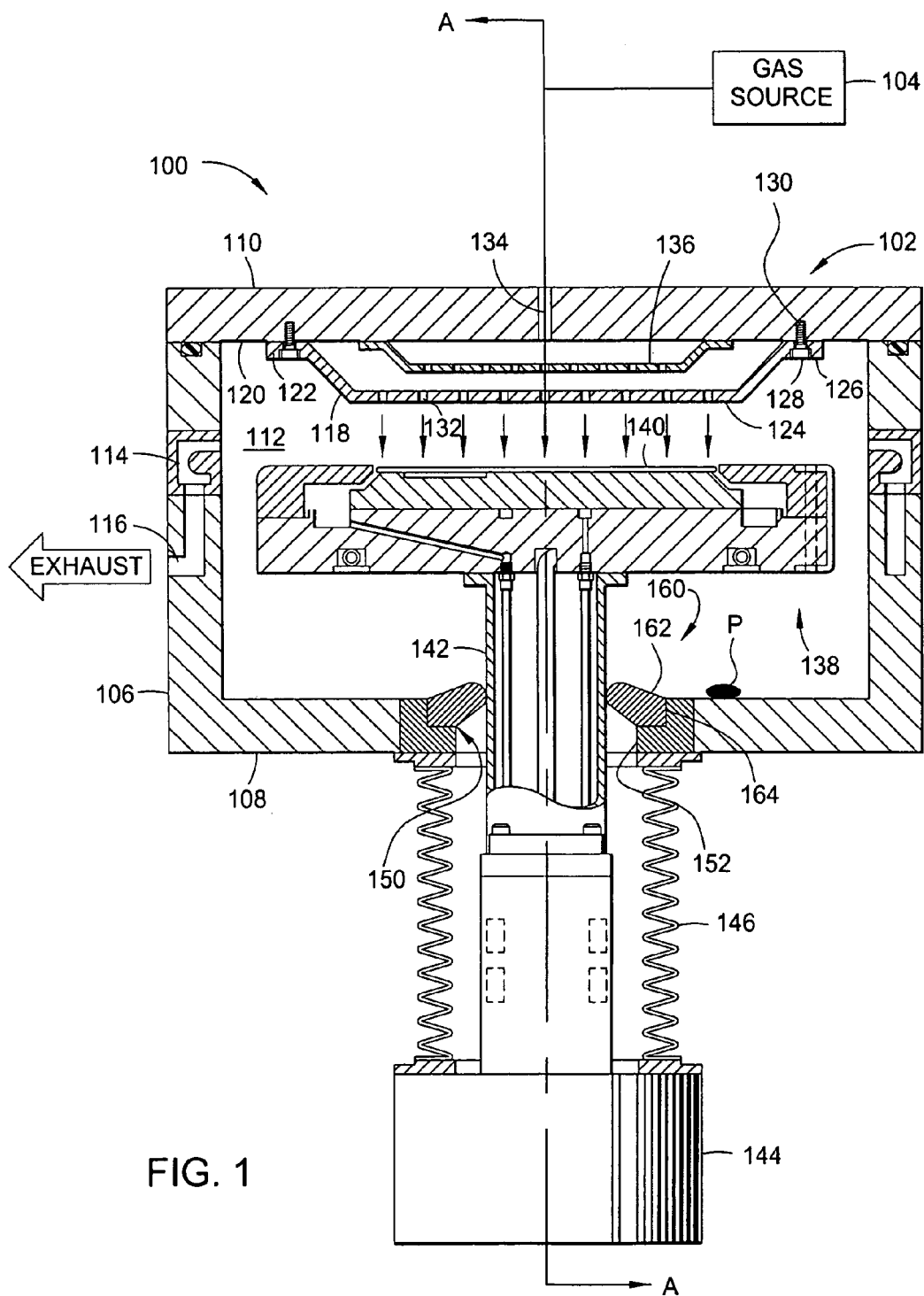
FIG. 1 depicts a schematic, sectional view of one embodiment of a processing chamber in which one embodiment of a guard ring according to the present invention is deployed.

FIG. 1 is a cross-sectional view of one embodiment of a chemical vapor deposition system 100 that is advantageously adapted to benefit from the present invention. The system 100 generally includes a chamber body 102 coupled to a gas source 104. The chamber body 102 has walls 106, a bottom 108 and a lid 110 that define a process volume 112. The walls 106 and bottom 108 are typically fabricated from a unitary block of aluminum. The chamber body 102 contains a pumping ring 114 that couples the process volume 112 to an exhaust port 116. The exhaust port 116 is coupled to various pumping components such as roughing, throttle valves and turbomolecular pumps (not shown) that exhaust and control the pressure within the process volume 112.

The lid 110 is supported by the walls 106 and can be removed to service the chamber body 102. The lid 110 is generally comprised of aluminum and may additionally contain heat transfer fluid channels for regulating the temperature of the lid 110 by flowing a heat transfer fluid therethrough.

A showerhead 118 is coupled to an interior side 120 of the lid 110. The showerhead 118 is typically fabricated from aluminum. The showerhead 118 generally includes a perimeter mounting ring 122 that surrounds a "dish-shaped" center section 124. The mounting ring 122 includes a plurality of mounting holes 126 that pass therethrough, each accepting a mounting screw 128 that threads into a mating hole 130 in the lid 110. The center section 124 includes a perforated area 132 that facilitates passage of gases therethrough.

A mixing block 134 is disposed in the lid 110. The mixing block 134 is coupled to the gas source 104, such that process and other gases may be introduced to the process volume 112 by passing through the mixing block 134 and showerhead 118. Typically, cleaning gases from a cleaning source (not shown) are also introduced through the mixing block 134 to the process volume 112. A perforated blocker plate 136 is disposed between the showerhead 118 and mixing block 134 to enhance the uniform distribution of gases passing through the showerhead 118 and into the chamber body 102. The blocker plate 136 is typically fabricated from aluminum.

A substrate support assembly 138 is disposed beneath the showerhead 118, typically centrally disposed within the chamber body 102. The support assembly 138 supports a substrate 140 during processing and includes an elevator shaft 142 coupled thereto. The support assembly 138 generally is fabricated from aluminum, ceramic or a combination of aluminum and ceramic. The support assembly 138 typically includes a vacuum port (not shown) and at least one embedded heating element (not shown). The vacuum port is used to apply a vacuum between the substrate 140 and support assembly 138, for securing the substrate to the substrate support assembly 138 during processing. The heating element, such as an electrode disposed in the support assembly 138, is coupled to a power source (not shown) for heating the support assembly 138 and substrate 140 positioned thereon to a predetermined temperature. In one embodiment, the heating element maintains the substrate 140 at a uniform temperature of about 150 to 400 degrees. Alternatively, heating lamps or other heat sources may be utilized to heat the substrate 140.

The shaft 142 is coupled between the support assembly 138 and an actuator 144. The shaft 142 provides a conduit for electrical leads, vacuum and gas supply lines between the support assembly 138 and other components of the system 100. The actuator 144 moves the support assembly 138 between an elevated position as shown for processing and a lowered position for facilitating substrate transfer. In addition, the actuator 144 may include a mechanism for rotating the shaft 142. A bellows 146 disposed between the support assembly 138 or shaft 142 and the chamber bottom 108 provides a vacuum seal between the process volume 112 and the atmosphere outside the chamber body 102 while facilitating movement of the support assembly 138.

In one embodiment, the shaft 142 is disposed substantially centrally through an aperture 152 formed in the chamber bottom 108. In another illustrated, the aperture 152 is formed in sleeve disposed in the chamber bottom 108. Alternatively, a sleeve may be formed integrally in the bottom 108 of the chamber body 102. The sleeve 150 is generally a bushing positioned in the chamber bottom 108 to prevent gauling or other wear issues as the shaft 142 moves through the aperture 152 formed in the bottom 108.

The support assembly 138 generally is grounded such that RF power supplied by a power source (not shown) to the showerhead 118 (or other electrode positioned within or near the lid assembly of the chamber) may excite the gases disposed in the process volume 112 between the support assembly 138 and the showerhead 118. The RF power, generally having a frequency of between a few Hz to 13 MHz or higher is provided in a wattage suitable for the substrate surface area. In one embodiment, the power source comprises a dual frequency source that provides a low frequency power at less than about 2 MHz (preferably about 200 to 500 kHz) and a high frequency power at greater than 13 MHz (preferably about 13.56 kHz). The frequencies may be fixed or variable. Illustratively, for a 550 mm×650 mm substrate, the low frequency power is about 0.3 to about 2 kW while the high frequency power is about 1 to 5 kW. Generally, the power requirements decrease or increase with a corresponding decrease or increase in substrate size.

As illustrated in FIG. 1, the bottom 108 of the chamber body 102 includes a guard ring 162 for reducing the entrapment of foreign matter between the shaft 142 and the aperture 152 of the sleeve 150. The guard ring 162 is an annular ring formed from a material that is chemically inert material to process chemistries and other conditions, such as polytetrafluoroethylene or polyetheretherketone. The guard ring 162 is positioned within a step 164 in the aperture 152 of the sleeve 150. In one embodiment, the guard ring 162 projects above the bottom 108 of the chamber body 102.

In operation, the semiconductor substrate 140 is secured to the support assembly 138 by providing a vacuum therebetween. The temperature of the substrate 140 is elevated to a pre-determined process temperature by regulating thermal transfer to the support assembly by the heating element. During the deposition process, the substrate is heated to a steady temperature, typically between 300° C. and 550° C.

Gaseous components, which in one embodiment may include silane and tungsten hexafluoride, are supplied from a gas panel to the process chamber through the mixing block 134 and showerhead 118 to form a gaseous mixture. The gaseous mixture reacts to form a layer of tungsten on the substrate 140. To prevent deposition at the substrate's edge and possible adherence of the substrate 140 to the support assembly 138, purge gases flow from a conduit in the support assembly 138 around the perimeter of the substrate 140.

Figure 2:
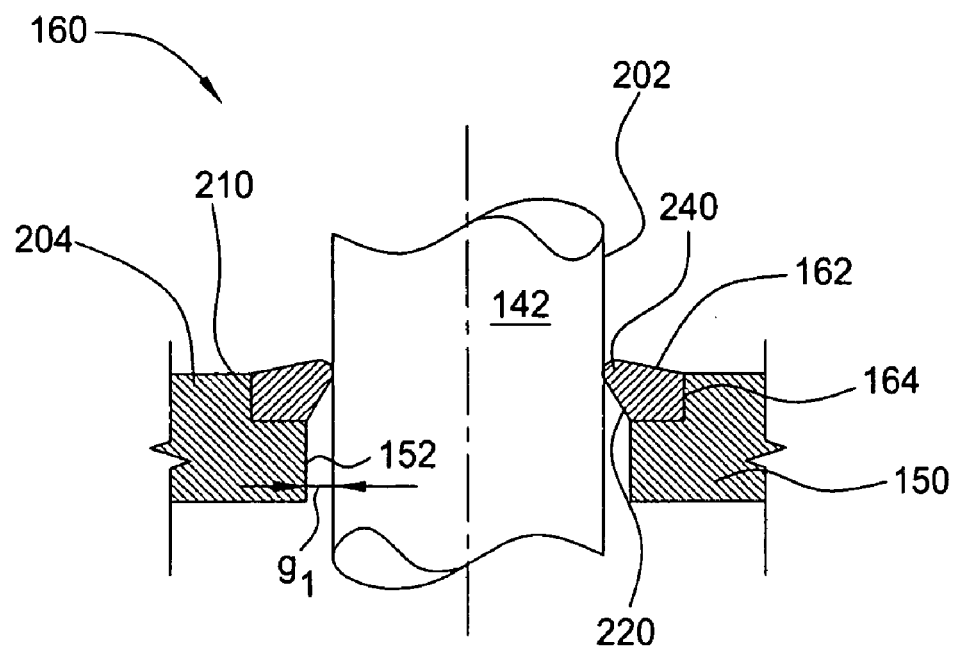
FIG. 2 is a cross-sectional view of one embodiment of a guard ring for use with the present invention.
Figure 3:
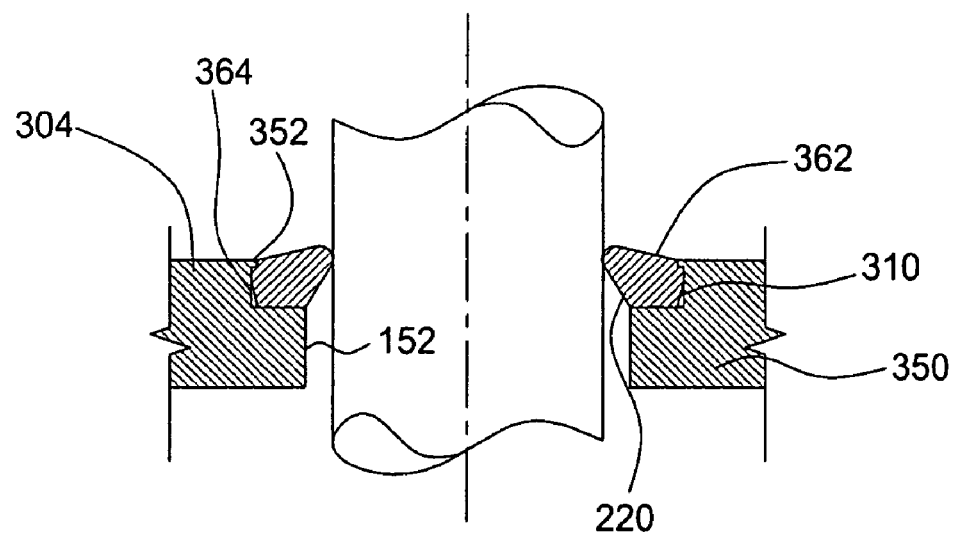
FIG. 3 is a cross-sectional view of another embodiment of a guard ring for use with the present invention.

FIG. 2 is a cross-sectional view of the guard ring 162 illustrated in FIG. 1. As discussed with reference to FIG. 1, the guard 162 is disposed within the sleeve 150. In one embodiment, the guard ring 162 is fixed to the sleeve 150 by adhesive. In another embodiment, the guard ring 162 is molded to the sleeve 150. The sleeve 150 circumscribes an outer surface 202 of the shaft 142 and is separated from the shaft 142 by a first gap $g_1$. A first end 204 of the aperture 152 formed in the sleeve 150 facing the interior of the chamber 102 includes the step 164 for receiving the guard ring 162. In one embodiment illustrated in FIG. 3, the step 364 further comprises a radially inward extending lip 352 positioned proximate to the first end 304 of the sleeve 350 for retaining the guard ring 362 within the aperture 152.

Returning to FIG. 2, the guard ring 162 includes an outer circumference 210 (i.e., the surface of the guard ring 162 that contacts the sleeve 150) and an inner perimeter 220. In one embodiment, the outer circumference 210 is formed substantially vertically to fit the shape of the step 164. In the embodiment illustrated in FIG. 3, the outer circumference 310 flares (radially) outward to facilitate engagement of the guard ring 362 with the lip 352 of the step 364.

Returning to FIG. 2, in one embodiment, the inner perimeter 220 is formed substantially as a wedge, so that the innermost point of the guard ring 162 forms a substantially V-shaped sealing lip 240 that extends upwardly and inwardly toward the center of the guard ring 162 and the shaft 142. The sealing lip 240 may contact the shaft 142 at a chiseled contact point. In one embodiment, the inner perimeter 220 of the guard ring 162 extends slightly above the step 164 on the sleeve 150, so that a surface of the guard ring 162 slopes slightly upward from the sleeve 150 to the shaft 142. The upward slope enables the guard ring 162 to capture and/or wipe particles from the shaft 142 as the shaft 142 moves along its longitudinal axis within the sleeve 150, thereby substantially preventing the particles from entering the gap $g_1$.

In one embodiment, the shaft 142 is positioned substantially concentrically within the sleeve 150, and the lip 240 is substantially continuous around the circumference of the shaft 142. However, if the shaft 142 shifts so that the shaft 142 becomes positioned eccentrically within the sleeve 150, the distance from the shaft 142 to the sleeve 150 will vary around the diameter of the shaft 152. Thus in one embodiment, the guard ring 162 is formed of a resilient material, and the sealing lip 240 has a diameter that is smaller than the diameter of the shaft 142 so that contact is maintained around the shaft's diameter even when there is eccentricity between the shaft 142 and sleeve 150.

The guard ring 162 is positioned to substantially prevent the entrapment of particles and loose foreign matter between the shaft 142 and the sleeve 150. Referring back to FIG. 1, a particle p that is generated within or introduced into the chamber body 102 may be free to move about the chamber and potentially become trapped between the shaft 142 and the sleeve 150, creating a hazard to the components of the chamber body 102. The guard ring 162 prevents the particle p, and similar particles, from entering and passing through the gap (e.g., $g_1$ in FIG. 2) between the shaft 142 and the sleeve 150, thereby substantially reducing particle damage to the shaft 142 and associated mechanisms.

Figure 4:
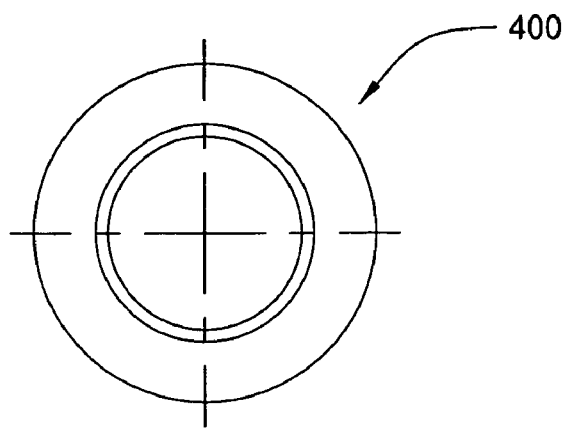
FIG. 4 is a top view of one embodiment of a guard ring according to the present invention.
Figure 5A:
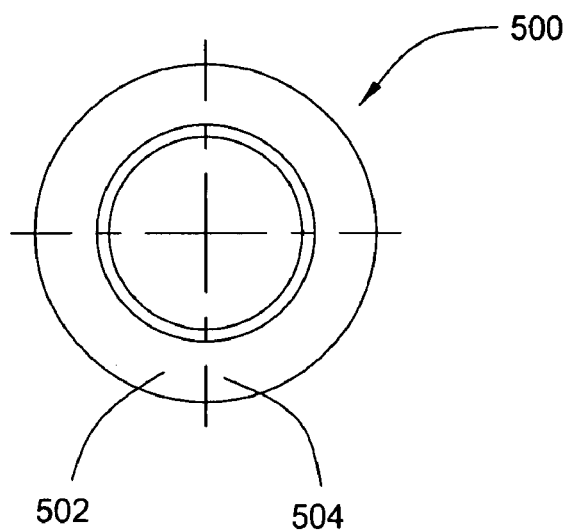
FIG. 5A is a top view of another embodiment of a guard ring according to the present invention, before installation.
Figure 5B:
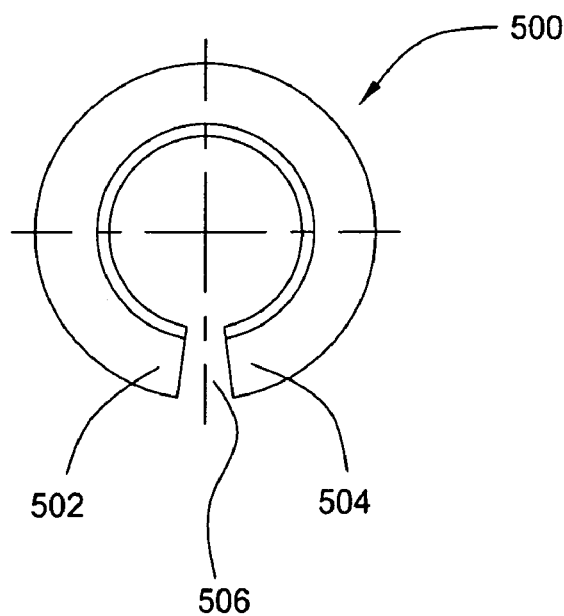
FIG. 5B is a top view of the guard ring illustrated in FIG. 5A, after installation.

In an embodiment illustrated in a top view of a guard ring 400 in FIG. 4, the guard ring 400 is formed as a continuous, closed ring. The geometry of the guard ring 400 may be formed similarly to the guard rings 162 and 362 discussed with relation to the preceding FIGS. In another embodiment, illustrated in top view in FIG. 5A, a guard ring 500 is formed as a split ring, wherein first and second ends 502, 504 of the ring 500 are separated by a small gap 506. The size of the gap 506 will vary depending on the size of the guard ring 500. FIG. 5A illustrates the guard ring 500 before installation. The sleeve compresses the guard ring 500 upon installation of the guard ring 500, closing the gap 506 as shown in FIG. 5B.

Figure 8:
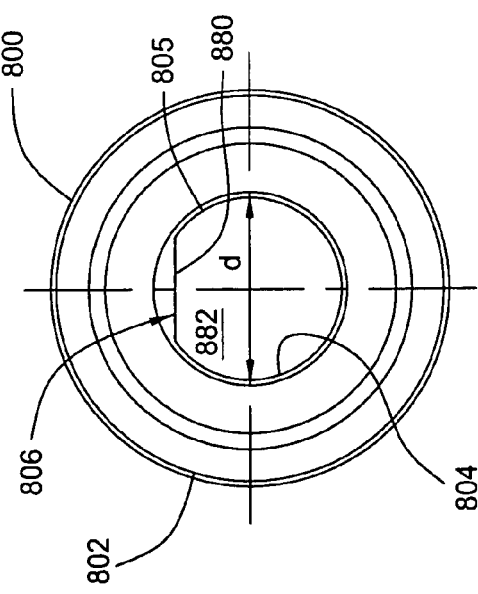
FIG. 8 is a top view of one embodiment of the guard ring illustrated in FIG. 7, wherein the guard ring is a unitary component.

FIG. 8 illustrates a top view of one embodiment of a guard ring 800 for use with a shaft having a flat surface on a portion of its circumference (not shown). In one embodiment, a guard ring 800 comprises a substantially continuous, closed ring. The guard ring 800 has an outer circumference 802 and an inner perimeter 804. The outer circumference 802 is formed substantially as a continuous ring; however, the inner perimeter 804 comprises a round portion 805 and a flat portion 806 that is outset perpendicular to the centerline of the guard ring 800. The flat portion 806 is positioned to contact a flat surface 880 of a shaft 882. The flat surface 880 of the shaft 882 prevents the guard ring 800 from rotating relative to the shaft 882.

Figure 9:
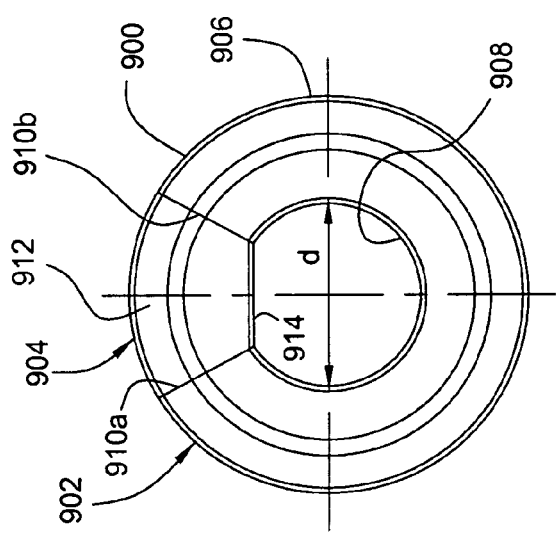
FIG. 9 is a top view of another embodiment of the guard ring illustrated in FIG. 7, wherein the guard ring comprises two pieces.

In another embodiment illustrated in FIG. 9, a guard ring 900 comprises a first component 902 and a second component 904 that sealingly engage each other to form a substantially annular ring 900. In one embodiment, the first component 902 is substantially C-shaped and comprises an outer circumference 906 and an inner perimeter 908. The first component 902 further comprises two ends 910a and 910b adapted to retain the second component 904 therebetween. The second component 904 comprises a substantially wedge-shaped piece having an arcuate outer surface 912 and a flat inner surface 914 that is sized to be substantially equal to a chord defined by the open ends 910a and 910b of the first component 902. The arcuate outer surface 912 is formed to substantially the same radius as the outer circumference 906 of the first component 902 when the second component 904 and the first component 902 are fit together; the flat inner surface 914 is positioned to contact the flat surface of the shaft (not shown) and is adapted to be positioned substantially parallel to a diameter d of the ring 900.

Figure 10:
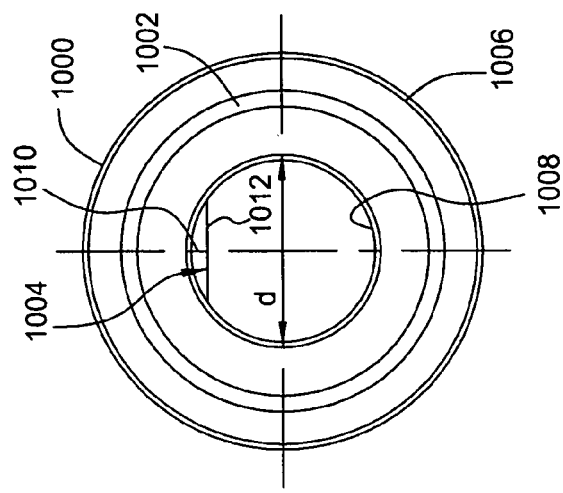
FIG. 10 is a top view of another embodiment of the guard ring illustrated in FIG. 7, wherein the guard ring is a unitary piece used in conjunction with an insert.

In another embodiment illustrated in FIG. 10, a guard ring 1000 comprises a ring 1002 and an insert 1004. In one embodiment, the ring 1002 is a substantially continuous, closed component, such as the guard ring 400 illustrated in FIG. 4, and has an outer circumference 1006 and an inner perimeter 1008. The insert 1004 comprises an arced surface 1010 and a flat surface 1012. The arced surface 1010 is formed to substantially conform to a portion of the inner perimeter 1008 of the ring 1002; the flat surface 1012 is positioned to face radially inward to contact the flat surface of a shaft (such as shown in FIG. 8), and is sized to be substantially equal to a chord defined by the flat surface of the shaft.

Figure 6A:
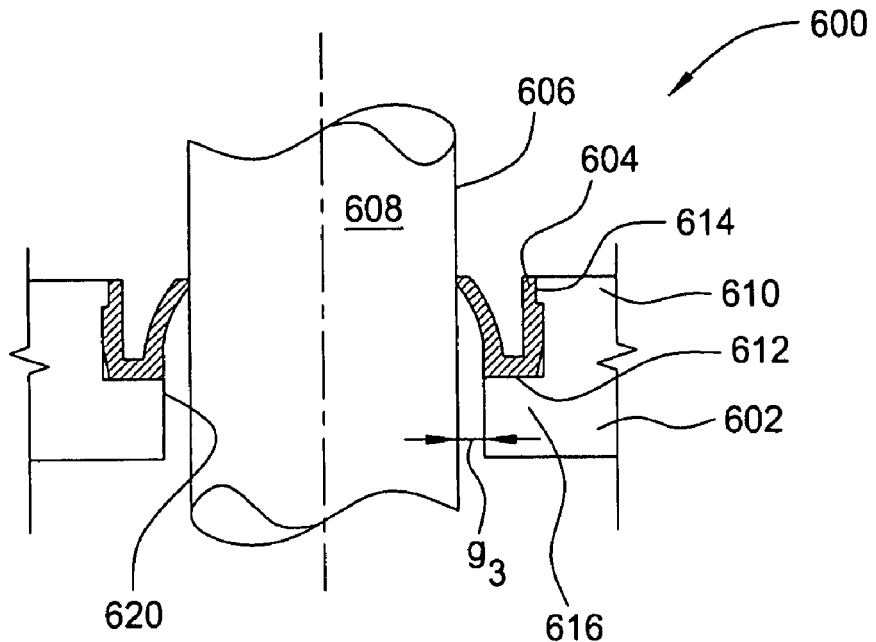
FIG. 6A is a cross-sectional view of another embodiment of a guard ring for use with the present invention, wherein the shaft is centered within the guard ring.
Figure 6B:
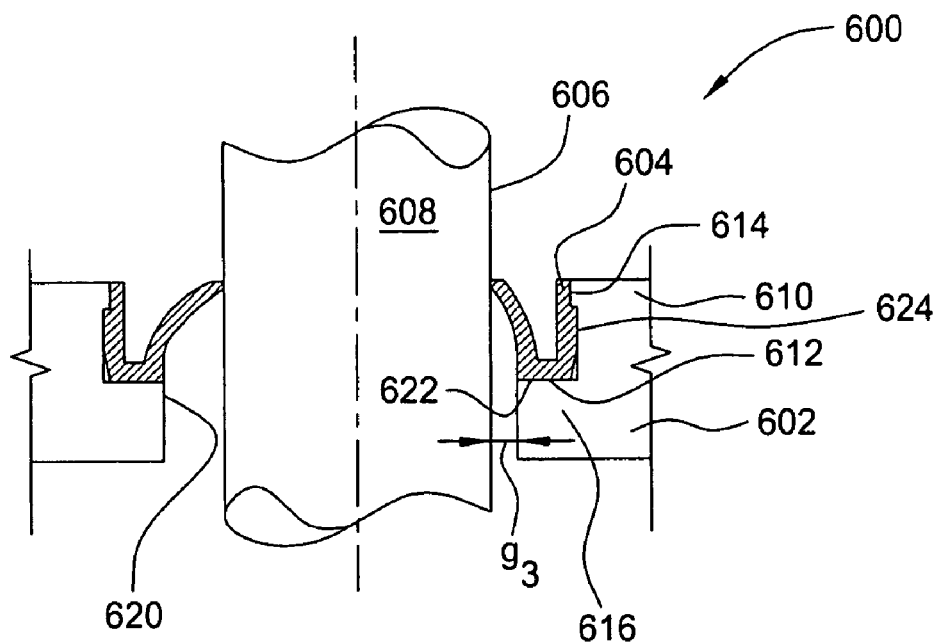
FIG. 6B is a cross-sectional view of the guard ring illustrated in FIG. 6A, wherein the guard ring functions as a spring against a displaced shaft.

FIGS. 6A and 6B illustrate cross-sectional views of another embodiment of a guard ring 604 according to the present invention. The guard ring 604, like the assemblies illustrated in FIGS. 2 and 3, comprises a resilient, annular ring 604 adapted to be positioned within a sleeve 602. The sleeve 602 is formed in a bottom of a chamber (not shown) and positioned to circumscribe the outer surface 606 of a shaft 608. A first end 610 of the sleeve 602 comprises a step 612 formed in an inner perimeter 620 for receiving the guard ring 604. In one embodiment, the step 612 further comprises a lip 614 that extends radially inward for holding the guard ring 604 within the step 612. A portion 616 of the unstepped region of the sleeve 602 is separated from the shaft 608 by a first gap $g_3$. In the embodiment illustrated in FIG. 6A, the shaft 608 is substantially centered within the guard ring assembly 600 so that the first gap $g_3$ is substantially constant around the circumference of the shaft 608. By contrast, FIG. 6B depicts the shaft 608 offset from the centerline of the sleeve 602 (and centerline of the chamber body, not shown).

Figure 7:
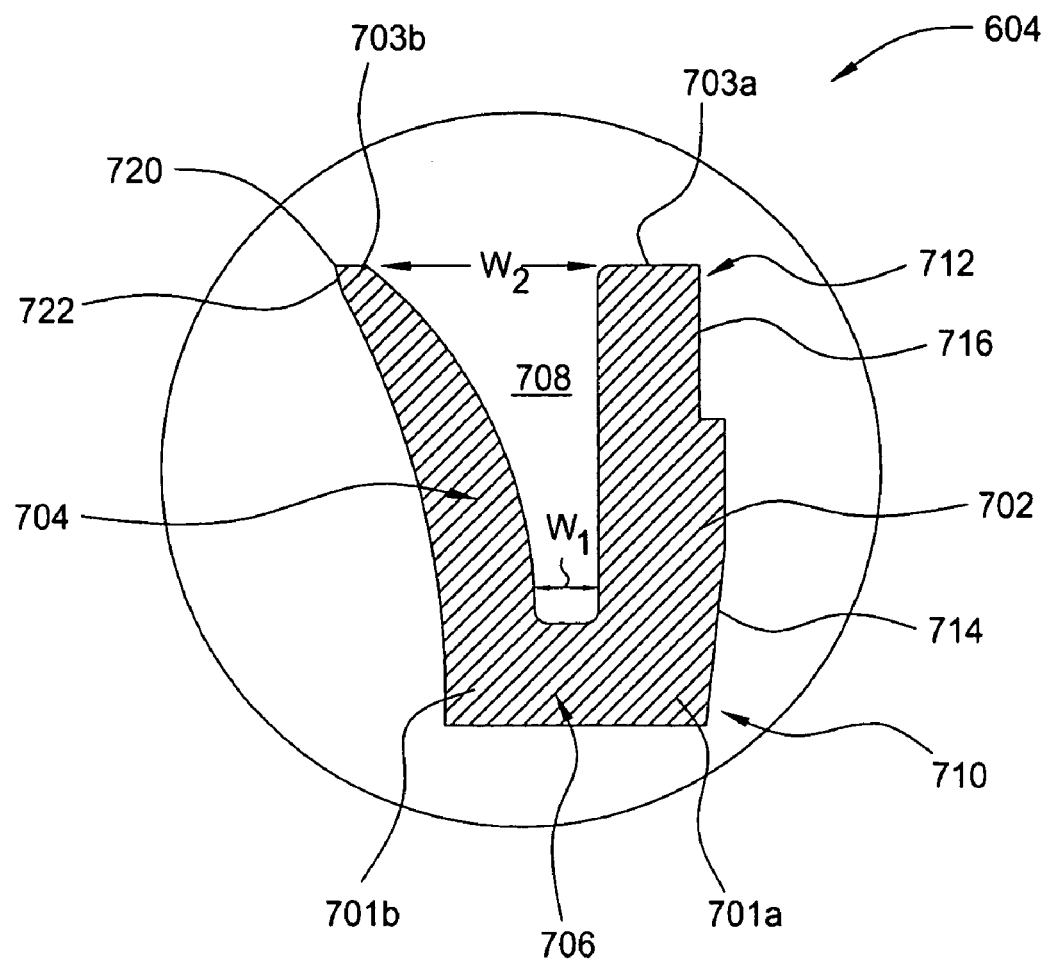
FIG. 7 is a detailed cross-sectional view of the guard ring illustrated in FIGS. 6A and 6B.

FIG. 7 illustrates a detailed cross-sectional view of the guard ring 604. The guard ring 604 comprises first and second flanges 702, 704 and a base portion 706. The first and second flanges 702, 704 each have first ends 701a, 701b and second ends 703a, 703b, respectively. The first ends 701a, 701b are coupled to opposite ends of the base portion 706, which is substantially flat. The first and second flanges 704, 706 are separated by a channel 708. A substantially fixed width $w_1$ separates the first ends 701a, 701b of the flanges 702, 704 (i.e., the portion of the channel proximate the base portion 706). The width of the channel 708 gradually increases in a direction away from the base portion 706, achieving the greatest width $w_2$ at a point that separates the second ends 703a, 703b of the flanges 702, 704.

Referring simultaneously to FIGS. 6B and 7, in one embodiment, the first flange 702 forms substantially a right angle with the base portion 706 of the guard ring 604, so that the first flange 702 and the base portion 706 lie substantially flat against first and second surfaces 622, 624 of the step 612. In another embodiment, a portion 714 of the first flange 702 that contacts the step 612 slopes slightly (radially) inward to facilitate installation of the guard ring 604 on the step 612. In one embodiment, the outer surface of the first flange 702 includes a small recess 716 located proximate to the second end 703a for engaging the retaining lip 614 on the step 612 of the sleeve 602. The second flange 704 has a tapered shape that extends radially inward (i.e., away from the first flange 702). The second end 703b of the second flange 704 comprises a chiseled contact point 720 adapted for contacting the shaft 608. In one embodiment, an outer edge 722 of the contact point 720 is tapered so that the remainder of the second flange's second end 703b substantially avoids contact with the shaft 608.

The guard ring 604 illustrated in FIGS. 6A-7 is designed to maintain contact with the shaft 608, while accommodating movement of the shaft 608 in a direction normal to the shaft's longitudinal axis and/or misalignment of the shaft 608 with respect to the sleeve 602. The first flange 702 remains substantially fixed in place against the step 612 of the sleeve 602; however, the curved shape of the second flange 704 allows the second flange 704 to function essentially as a spring, thereby allowing the guard ring 604 to maintain continuous contact with the perimeter of the shaft 608, even when the shaft 608 and guard ring 604 are not concentrically aligned. Thus, as illustrated in FIG. 6B, as the shaft 608 shifts position, force exerted by the shaft 608 on the second end 703b of the second flange 704 may cause the second flange 704 to bend radially outward (i.e., toward the first flange 702). The channel 708 between the flanges 702 and 704 is sufficiently wide at its narrowest point $w_1$ to substantially prevent the second flange 704 from physically contacting the first flange 702 when the second flange 704 is bent due to contact with the shaft 608.

Thus, the present invention represents a significant advancement in the fabrication and processing of integrated circuits. A guard ring and assembly are provided that substantially prevent the entrapment of particles and foreign matter between a sleeve and a substrate support having a moveable shaft. Therefore, the occurrence of premature wear and/or failure of a processing system due to particle entrapment is substantially reduced.

Although the teachings of the present invention that have been shown and described in detail in a plasma enhanced chemical vapor deposition chamber, those skilled in the art can readily devise other varied embodiments in other processing chambers that incorporate the use of lift pins to separate a substrate from a support surface that still incorporate the teachings and do not depart from the scope and spirit of the invention.

| REFERENCE NUMERALS | |
|---|---|
| Chemical vapor deposition system | 100 |
| Chamber body | 102 |
| Gas source | 104 |
| Walls | 106 |
| Bottom | 108 |
| Lid | 110 |
| Process volume | 112 |
| Pumping ring | 114 |
| Exhaust port | 116 |
| Showerhead | 118 |
| Interior side | 120 |
| Perimeter mounting ring pg 5 | 122 |
| Dish-shaped center section | 124 |
| Mounting holes | 126 |
| Mounting screw | 128 |
| Mating hole | 130 |
| Perforated area | 132 |
| Mixing block | 134 |
| Blocker plate | 136 |
| Substrate support assembly | 138 |
| Substrate | 140 |
| Elevator shaft | 142 |
| Actuator | 144 |
| Bellows | 146 |
| Sleeve | 150 |
| Aperture | 152 |
| Guard ring | 162 |
| Step | 164 |
| Outer surface | 202 |
| Outer circumference | 210 |
| Inner perimeter | 220 |
| v-shaped sealing lip | 240 |
| First end | 304 |
| Outer circumference | 310 |
| Sleeve | 350 |
| Extending lip | 352 |
| Guard ring | 362 |
| Step | 364 |
| Guard ring | 400 |
| Guard ring | 500 |
| First ends | 502 |
| Second ends | 504 |
| Small gap | 506 |
| Guard ring assembly | 600 |
| Sleeve | 602 |
| Guard ring | 604 |
| Outer surface | 606 |
| Shaft | 608 |
| First end | 610 |
| Step | 612 |
| Retaining lip | 614 |
| Portion | 616 |
| Inner perimeter | 620 |
| First surface | 622 |
| Second surface | 624 |
| First ends | 701a |
| First end | 701b |
| First flange | 702 |
| Second ends | 703a |
| Second ends | 703b |
| Second flange | 704 |
| Base portion | 706 |
| Channel | 708 |
| Portion | 714 |
| Small recess | 716 |
| Chiseled contact point | 720 |
| Outer edge | 722 |
| Guard ring | 800 |
| Outer circumference | 802 |

-continued

| REFERENCE NUMERALS | |
|---|---|
| Inner perimeter | 804 |
| Round portion | 805 |
| Flat portion | 806 |
| Flat surface | 880 |
| Shaft | 882 |
| Guard ring | 900 |
| First component | 902 |
| Second component | 904 |
| Outer circumference | 906 |
| Inner perimeter | 908 |
| End | 910a |
| End | 910b |
| Arcuate outer surface | 912 |
| Flat inner surface | 914 |
| Guard ring | 1000 |
| Ring | 1002 |
| Insert | 1004 |
| Outer circumference | 1006 |
| Inner perimeter | 1008 |
| Arced surface | 1010 |
| Flat surface | 1012 |

What is claimed:

1. A semiconductor processing chamber comprising:
a chamber body having an aperture formed in a bottom of the chamber body;
a substrate support disposed in the chamber body;
a moveable shaft coupled to the substrate support, the movable shaft extending through the aperture;
a step formed in an inner surface of the aperture and a substantially annular guard ring positioned within the step;
wherein the guard ring further comprises:
a base portion having an outer circumference and an inner perimeter, wherein the outer circumference contacts the step and the inner perimeter is adapted for substantially sealing a gap between the shaft and the aperture; and
wherein the inner perimeter is formed substantially as a wedge portion, that slopes radially inwards and upwards into sealing contact with the shaft.

2. The chamber of claim 1, wherein the step further comprises:
a lip formed in the step adapted to retain the guard ring within the step.

3. The chamber of claim 1, wherein the outer circumference is formed as a substantially right angle to a bottom surface of the step.

4. The chamber of claim 1, wherein the outer circumference flares outward toward the substrate support.

5. The chamber of claim 1, wherein a surface of the wedge slopes upward to project above the bottom of the chamber body.

6. The chamber of claim 1, wherein the guard ring further comprises:
a first flange coupled to the base portion and disposed against the shaft, the first flange defining the wedge;
a second flange coupled to the base portion and disposed against the step formed in the inner surface; and
a channel separating the first flange from the second flange.

7. The chamber of claim 6, wherein the second flange forms a substantially ninety-degree angle with the base portion.

8. The chamber of claim 6, wherein at least a portion of an inner surface of the second flange comprises a recess for engaging a lip formed on the step.

9. The chamber of claim 6, wherein a first end of the first flange comprises a tapered tip, the first end being disposed distal from the base portion.

10. The chamber of claim 6, wherein the channel is wide enough to substantially prevent contact between the first and second flanges.

11. The chamber of claim 6, wherein the guard ring is formed as a closed, continuous ring.

12. The chamber of claim 6, wherein the ring is formed as a split ring adapted for closing upon compression of the guard ring.

13. The chamber of claim 6, wherein the ring is formed as a two-component ring comprising:
a first, substantially C-shaped component; and
a second, substantially wedge-shaped component comprising:
an arcuate outer portion having a radius conforming to the radius of the outer circumference of the ring; and
a flat inner portion substantially parallel to a diameter of the ring,
wherein the first component and the second component are adapted to be fit together to form the ring.

* * * * *